United States Patent
Hung et al.

(10) Patent No.: US 7,148,089 B2
(45) Date of Patent: Dec. 12, 2006

(54) METHOD FOR FORMING COPPER FUSE LINKS

(75) Inventors: Meng-Chi Hung, Douliou (TW); Hao-Yi Tsai, Hsinchu (TW); Shang-Yong Hou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 169 days.

(21) Appl. No.: 10/791,606

(22) Filed: Mar. 1, 2004

(65) Prior Publication Data

US 2005/0189612 A1    Sep. 1, 2005

(51) Int. Cl.
*H01L 21/82* (2006.01)

(52) U.S. Cl. ..................................... 438/132

(58) Field of Classification Search ................ 438/622, 438/612, 613, 467, 132, 108
See application file for complete search history.

(56) References Cited

U.S. PATENT DOCUMENTS

| 6,376,353 B1 * | 4/2002 | Zhou et al. ................. 438/612 |
| 6,562,711 B1 * | 5/2003 | Powers ....................... 438/622 |

* cited by examiner

*Primary Examiner*—Carl Whitehead, Jr.
*Assistant Examiner*—Monica D. Harrison
(74) *Attorney, Agent, or Firm*—Tung & Associates

(57) ABSTRACT

An improved fuse link structure and method of forming the same, the method including forming a dual damascene structure by a trench-first process to form a dual damascene having a relatively thinner fuse link portion spanning an area between and overlying fuse metal interconnect structures including a mechanically robust dielectric insulating layer portion underlying the relatively thinner fuse link portion.

27 Claims, 3 Drawing Sheets

METHOD FOR FORMING COPPER FUSE LINKS

FIELD OF THE INVENTION

This invention generally relates to semiconductor processing methods including formation of multiple layer semiconductor devices and more particularly to an improved copper fuse link structure and method for forming the same.

BACKGROUND OF THE INVENTION

Fuses are frequently used to reconfigure memory and logic circuitry. For example, in dynamic or static memory chips, defective memory cells or circuitry may be replaced by selectively blowing (destroying) fuses associated with the defective circuitry while activating redundant circuitry to form new circuitry. This circuit rerouting technique using selectively destroyed fuse links contributes to enhanced yields without the necessity of scrapping defective process wafers.

Generally, fuse links, made of a conductive material such as a metal, may be destroyed to form an open circuit by passing an excessive electrical current through the circuitry which melts the fuse link or by exposing the fuse link to intense laser irradiation to ablate the fuse link. Typically a window is formed above the fuse link of thin transparent material, for example oxide, to allow sufficient laser energy to impact the fuse link.

In more recent practices, the laser ablation method is preferred since it is faster, more accurate and leaves less residue within the fuse link window area. However, as device sizes decrease to 0.25 microns and multilevel device circuitry is employed to achieve the desired circuit density, Low-K (low dielectric constant) materials have become necessary in the formation of dielectric insulating layers, also referred to as inter-metal dielectric (IMD) layers in order to reduce circuit capacitance and therefore increase signal transport speeds. Low-K materials way include porous inorganic silicon oxide based materials which are generally less mechanically strong and subject to cracking when subjected to thermal mismatch stresses.

Another problem with the use of low-K materials is the poor adhesive strength of such materials which are susceptible to delamination in the presence of induced stresses including thermal mismatch stresses. Guard rings have been proposed for use around fuse areas to prevent the migration of contamination from the fuse link area into surrounding dielectric insulating areas following the 'blowing' of fuses to reconfigure the device circuitry.

Generally fuse link structure have been limited to metals with a low melting point, such as aluminum since less energy is required to destroy the fuses, and sufficient energy can easily be transported through overlying light transparent windows. While the use of copper would be desirable in that the same process technology could be used for forming the fuse link structure as is used for forming metal interconnects in underlying layers, such as damascenes, the use of copper damascene fuse links has presented several problems in implementation.

For example, copper generally requires much higher levels of energy to destroy a copper fuse, due to its high thermal conductivity and it higher melting point compared to aluminum. In addition, the fuse link layer, also referred to as a redundancy layer, is typically a thicker layer for various reasons with the metal fuses having thicknesses of about 10,000 Angstroms. The use of high laser energies or electrical current energies required to destroy a copper fuse frequently causes damage to underlying dielectric insulating layers, for example low-K dielectric insulating layers, thereby reducing wafer yield and device reliability.

Therefore, there is a need in the semiconductor processing art to develop a structure and method of forming copper fuse links such that the fuse links may be reliably formed and destroyed in a circuit reconfiguration process while avoiding damage to underlying dielectric insulating layers.

It is therefore an object of the invention to provide a structure and method of forming copper fuse links such that the fuse links may be reliably formed and destroyed in a circuit reconfiguration process while avoiding damage to underlying dielectric insulating layers, in addition to overcoming other shortcomings of the prior art.

SUMMARY OF THE INVENTION

To achieve the foregoing and other objects, and in accordance with the purposes of the present invention, as embodied and broadly described herein, the present invention provides an improved fuse link structure and method for forming the same.

In a first embodiment, the method includes providing first and second metal interconnect structures each respectively electrically interconnected to form fuse interconnect portions extending through a plurality of dielectric insulating layers including an uppermost metal interconnect layer; forming a first dielectric insulating layer over the uppermost metal interconnect layer; forming at least a second dielectric insulating layer over the first dielectric insulating layer; carrying out a first photolithographic patterning and etching step to form first and second trench line openings through a thickness of the at least a second dielectric insulating layer to respectively overlie the first and second metal interconnect structures; carrying out a second photolithographic patterning and etching step to form first and second via openings extending from a bottom portion of the respective first and second trench line openings through the thickness of the first dielectric insulating layer to overlie the respective first and second metal interconnect structures while simultaneously etching away a predetermined thickness of the at least a second dielectric insulating layer spanning an area between and overlying the first and second via openings; and, filling the first and second via openings and first and second trench line openings with a metal to form a metal fuse link electrically interconnecting the first and second metal interconnect structures to form a metal fuse link portion comprising the predetermined thickness.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained in exemplary implementation with respect to a multi-level fuse interconnect structure with a surrounding multi-level guard ring structure, it will be appreciated that the number of underlying IMD layers through which the guard ring structure and the fuse interconnect structure respectively extend through may vary depending on the particular semiconductor device. It will also be appreciated that the fuse link structure forms a portion of integrated circuitry structure and is electrical communication with underlying CMOS transistor structures formed over a semiconductor wafer in underlying levels. It will further be appreciated that although the method and structure of the present invention is advantageously used for forming copper damascenes, that other metals or conductive material may be advantageously used as well including for example CuAl alloys.

It will additionally be appreciated that the metallization levels including interconnecting vias may be formed by single or dual damascene processes where the metallization layers may include different metals or conductive material in each metallization layer. For example, the guard ring structure surrounding the fuse link area and the fuse interconnect structures may be formed of any metal including alloys of copper, tungsten, and aluminum as well as including etch stop layers such as metal nitrides, metal oxynitrides, metal carbides and metal oxycarbides between IMD layer portions and barrier/adhesive layers lining the filled metal damascenes. The guard ring structure is preferably included to surround the fuse link circuitry extending through at least about three metallization levels to prevent crack propagation and residual metal diffusion following a fuse blowing operation. The guard ring structure is electrically isolated, formed of dummy metal interconnect portions.

Figure 1A:
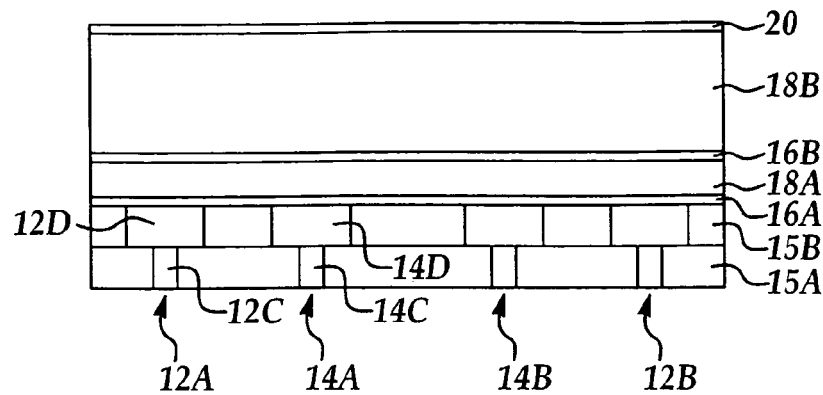
FIGS. 1A–1E are cross sectional views of a fuse link structure including a surrounding guard ring structure shown at stages in manufacture according to an embodiment of the present invention.

For example, referring to FIG. 1A is shown a cross sectional portion including a fuse interconnect structure portions in a multi-level semiconductor device including a plurality of metallization levels, together with associated metal interconnects. For example, metal interconnect portions 12A and 12B represent cross sectional portions of a conventional guard ring structure formed from stacked conductive e.g., copper damascene portions e.g., 12C and 12D. The guard ring structure portions 12A and 12B are formed to surround fuse interconnect circuitry structures e.g., 14A and 14B also formed from stacked conductive portions, e.g., copper dual damascene portions e.g., via portion 14C and trench line portion 14D. For example, the guard ring metal interconnect portions, 12A, 12B and fuse interconnect portions, 14A, 14B, are formed in parallel within, and extending through, a plurality of low-K inter-metal dielectric (IMD) layers including IMD layers 15A and 15B. For example, suitable inorganic low-K materials for forming low-K IMD layers include carbon doped oxide, also referred to as organo-silane glass (OSG). For example, the fuse interconnect circuitry portions 14A and 14B extend downward through underlying IMD layers to make electrical contact with transistor structures (not shown) to form a portion of an integrated circuit. The metal interconnect portions of the guard ring and fuse interconnect circuitry are formed by known methods including methods for forming copper damascene and dual damascene structures in one or more IMD layers, where each IMD layer including e.g., 15A and 15B are separated by etch stop and/or capping layers (not shown).

Still referring to FIG. 1A, overlying metal interconnect layer 15A, is formed a first etch stop layer 16A. The first etch stop layer 16A is preferably formed of a carbide or nitride, preferably silicon nitride (e.g., SiN) or silicon carbide (e.g., SiC) to a thickness of about 300 Angstroms to about 600 Angstroms by a conventional PECVD or LPCVD process.

Still referring to FIG. 1A, formed overlying the first etch stop layer 16A is formed a first dielectric insulating layer (via IMD layer) 18A, for example formed of a mechanically robust oxide such as a field oxide including undoped silicate glass (USG) by a conventional CVD or PECVD process, CVD silicon dioxide ($SiO_2$), PECVD silicon dioxide ($SiO_2$), and TEOS silicon oxide. Preferably, the first dielectric insulating layer 18A is formed to have a thickness of between about 2500 Angstroms and 5000 Angstroms, more preferably between about 3000 Angstroms and 4000 Angstroms. Formed overlying first dielectric insulating layer 18A is formed a second etch stop layer 16B. The second etch stop layer 16B is formed in the same manner and using preferred materials as outlined for the first etch stop layer 16A. Preferably, the second etch stop layer 16B is formed slightly thicker than the first etch stop layer 16A, for example from about 500 Angstroms to about 800 Angstroms.

Still referring to FIG. 1A, in a first embodiment, of the present invention a second dielectric insulating layer (trench IMD layer) 18B is formed over the second etch stop layer 16B, formed in the same manner and using the same preferred materials as outlined for the first dielectric insulating layer 18A. The thickness of the second dielectric insulating layer 18B will vary depending on the particular fuse link circuitry. For example, for a redundancy layer, also referred to as a redistribution layer (RDL), in a redundant memory circuit, for example a DRAM circuit, the second dielectric insulating layer 18B is typically formed at a thickness of between about 10000 Angstroms and 20000 Angstroms. In other conventional circuitry, for example where the fuse link is a circuitry element portion, for example an inductor circuitry element, the second dielectric insulating layer 18B is typically formed at a thickness of between about 20000 Angstroms and 40000 Angstroms. Overlying the second dielectric insulating layer 18B, is preferably formed a bottom anti-reflectance coating layer (BARC) 20, either an organic or inorganic material, more preferably an inorganic BARC, for example silicon oxynitride by conventional processes.

Figure 1B:
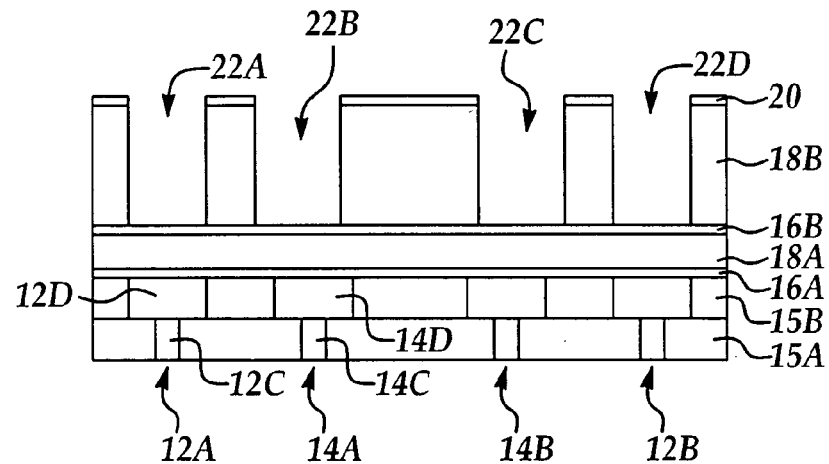

Referring to FIG. 1B, according to an aspect of the invention a trench first dual damascene process is carried out by carrying out a first conventional photolithographic patterning process and reactive ion etch (RIE) process, for example using a fluorine containing etching chemistry to form trench line openings e.g., 22A, 22B, 22C, and 22D overlying metal interconnect portions of the fuse interconnect circuitry, 14A and 14B and the guard ring interconnect structure 12A and 12B. The trench line openings are formed by a conventional RIE etch process to extend through the BARC layer 20 and the second dielectric insulating layer 18B to stop on the second etch stop layer 16B. Following the photolithographic patterning process the trench photoresist layer (not shown) is removed according to a conventional plasma ashing and/or wet stripping process.

Figure 1C:
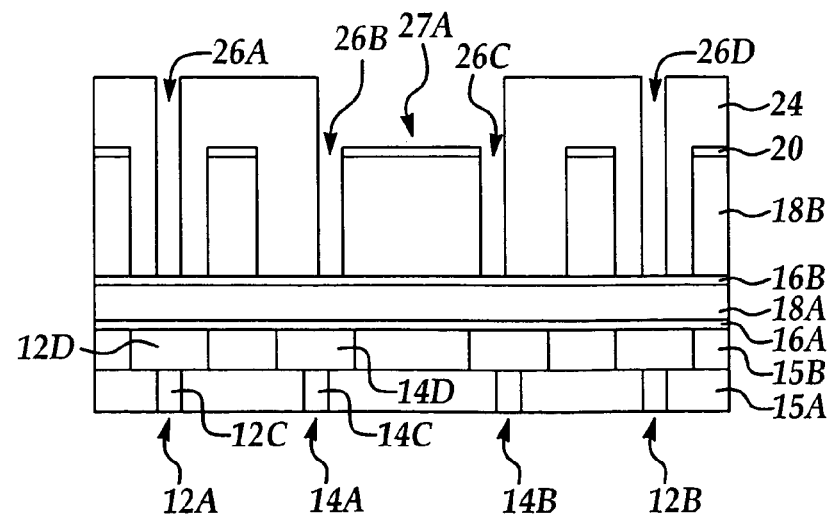

Referring to FIG. 1C, a second photolithographic patterning process is then carried out including depositing a photoresist layer 24 and patterning it by conventional exposure and development process to partially cover portions of the trenches to leave via opening etching patterns e.g., 26A, 26B, 26C, and 26D overlying the second etch stop layer 16B and the first dielectric insulating layer 18A. An area, e.g. 27A overlying the second dielectric insulating layer between via openings 26B and 26C spanning the areas between fuse link circuitry portions 14A and 14B is left uncovered by photoresist layer 24 in the patterning process.

Figure 1D:
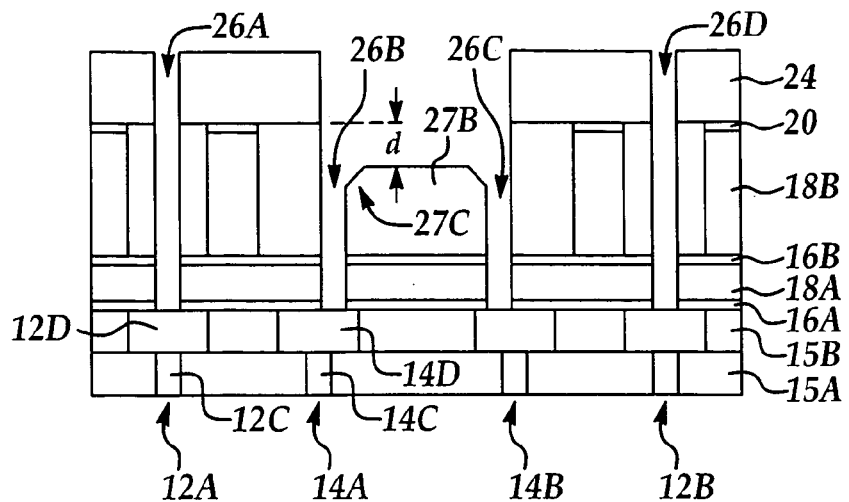

Referring to FIG. 1D, a second conventional RIE etching process is carried out to etch through the second etch stop layer 16B, through the first dielectric insulating layer 18A and through at least a portion of the first etch stop layer 16A to extend via openings e.g., 26A, 26B, 26C, and 26D through the thickness of the first dielectric insulating layer 18A according to the via etching pattern in photoresist layer 24. During the second RIE etching process a portion of the second dielectric layer 18B underlying exposed area 27A is simultaneously etched away a predetermined thickness of the second dielectric insulating layer portion 27B. The dielectric layer portion 27B is preferably etched to a depth e.g., d, preferably from about 1500 Angstroms to about 5500 Angstroms, more preferably between about 2500 Angstroms and about 3500 Angstroms measured from the original height of the uppermost portion of the second dielectric insulating layer 18B. In addition, edges of the exposed second dielectric layer portion 27B are etched during the second RIE etching process to form angled edge portions e.g., 27C.

Figure 1E:
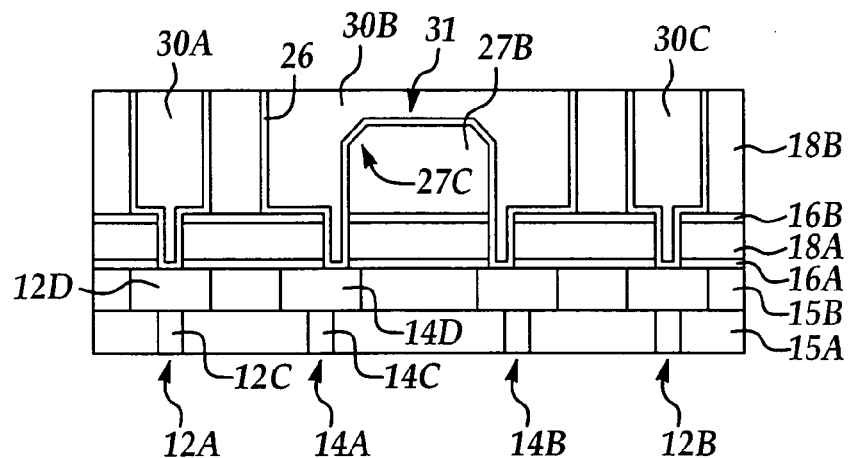

Referring to FIG. 1E, following removal of the photoresist layer 24, for example by a conventional plasma ashing and/or wet stripping process, and removal of a remaining portion of the first etch stop layer 16A to expose the underlying copper (form closed communication with) fuse circuitry portions e.g., 14D and guard ring portions, e.g., 12D conventional processes are carried out to form copper filled dual damascenes e.g., 30A, 30B, and 30C including a relatively thinner spanning fuse link portion 31 spanning the fuse link circuitry portions 14A and 14B overlying dielectric insulating portion 27B, preferably having a predetermined minimum thickness between about 1500 Angstroms to about 5500 Angstroms, more preferably between about 2500 Angstroms and about 3500 Angstroms. In completing the copper filled dual damascene structures 30A, 30B, and 30C, one or more refractory metal and or/refractory metal nitride barrier layers e.g., 26, for example TaN or TiN, are deposited to line the dual damascene openings, for example by a PECVD process. A copper seed layer (not shown) is then deposited over the barrier layer followed by a copper electrochemical deposition process to fill the dual damascene openings and a CMP process to remove excess deposited copper above the trench level and selected layers above the second dielectric insulating layer 18B, such as barrier layer 26 and BARC layer 20.

Figure 2A:
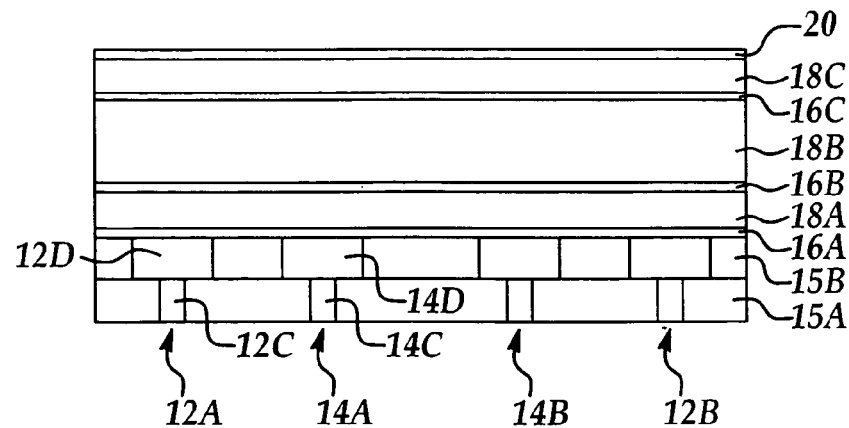
FIGS. 2A–2B are cross sectional views of a fuse link structure including a surrounding guard ring structure shown at stages in manufacture according to another embodiment of the present invention.

Referring to FIG. 2A, according to a preferred second embodiment, a third etch stop layer 16C is formed at a predetermined height after depositing a portion of the second dielectric layer 18B, for example using the same preferred materials and process outlined for etch stop layers 16A and 16B. A third dielectric insulating layer 18C, forming a portion of the trench dielectric insulating layer is then formed over the third etch stop layer 16C, for example using the same process and preferred materials and outlined for the first and second dielectric insulating layers 18A and 18B. Preferably, the third dielectric insulating layer 18C is formed to a predetermined thickness of a subsequently formed spanning fuse link portion, e.g., 31, having preferred thicknesses as outlined for the first embodiment of between about 1500 Angstroms to about 5500 Angstroms, more preferably between about 2500 Angstroms and about 3500 Angstroms. The BARC layer 20 is then formed over the third dielectric insulating layer 18C.

Figure 2B:
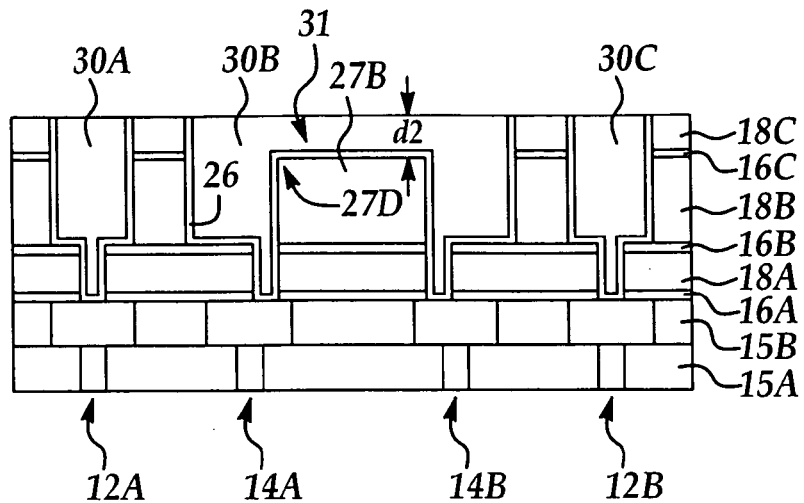

Referring to FIG. 2B, following a similar process as outlined for the first embodiment in FIGS. 1C through 1G, copper dual damascenes e.g., 30A, 30B, and 30C are formed according to a trench first process including forming spanning fuse link portion 31 formed overlying dielectric insulating layer portion 27B. The advantage of the second embodiment is that during the via etching step, the third dielectric insulating layer 18C is etched away to stop at a predetermined distance, d2, determined by the thickness of the dielectric insulating layer 18C and the third etch stop layer 16C. Advantageously, the etch stop layer 16C serves the purpose of allowing formation of more repeatable predetermined thickness of the spanning fuse link portion 31 and allows formation of squarer edges e.g., 27D (e.g., edges approaching a right angle) of dielectric insulating layer portion 27B during the etching process. As a result the spanning fuse link portion 31 may then be advantageously formed at the preferred thickness over a wider portion of the dual damascene fuse link. As a result, a subsequent laser ablation or fuse blowing process is rendered more reliable.

It will be appreciated that following the damascene formation process a fourth dielectric insulating layer (not shown) may optionally be deposited over the copper filled dual damascenes and an etching process carried out to form a transparent thin window over the fuse link portion e.g., 31 to allow for subsequent optional laser ablation of the fuse link.

Other advantages of the fuse link structure and method of forming the same according to embodiments of the present invention include the formation of a relatively thick dielectric insulating portion e.g., 27B underlying the spanning fuse link portion, for example from about 5,000 Angstroms to about 35,000 Angstroms. As a result, a larger thermal mass with increased mechanical strength is provided underlying the spanning fuse link portion e.g., 31 whereby induced thermal stresses during a laser ablation or fuse blowing process are less likely to damage to underlying low-K insulating layers, for example causing delamination and peeling.

In addition, the preferred thickness of the fuse link structure allows lower laser powers or electrical currents to be used in the fuse blowing process, thereby advantageously overcoming many of the problems associated with using copper damascene technology for fuse links. In addition, since the fuse link spanning portion e.g., 31 is thinner, the thicker portions of the dual damascene 30B, on either side of the dielectric insulating layer portion e.g., 27B, may be made wider, thereby providing a wider process margin for alignment of the via portions with underlying metal interconnects, e.g., 12D, and 14D. As a result, a larger via size with a wider process margin may be formed in the first dielectric layer e.g., 18A. Generally, the improved fuse link structure and method for forming the same according to preferred embodiments improves both the wafer yield in forming the fuse link structure and the wafer yield in the fuse blowing process.

Figure 3:
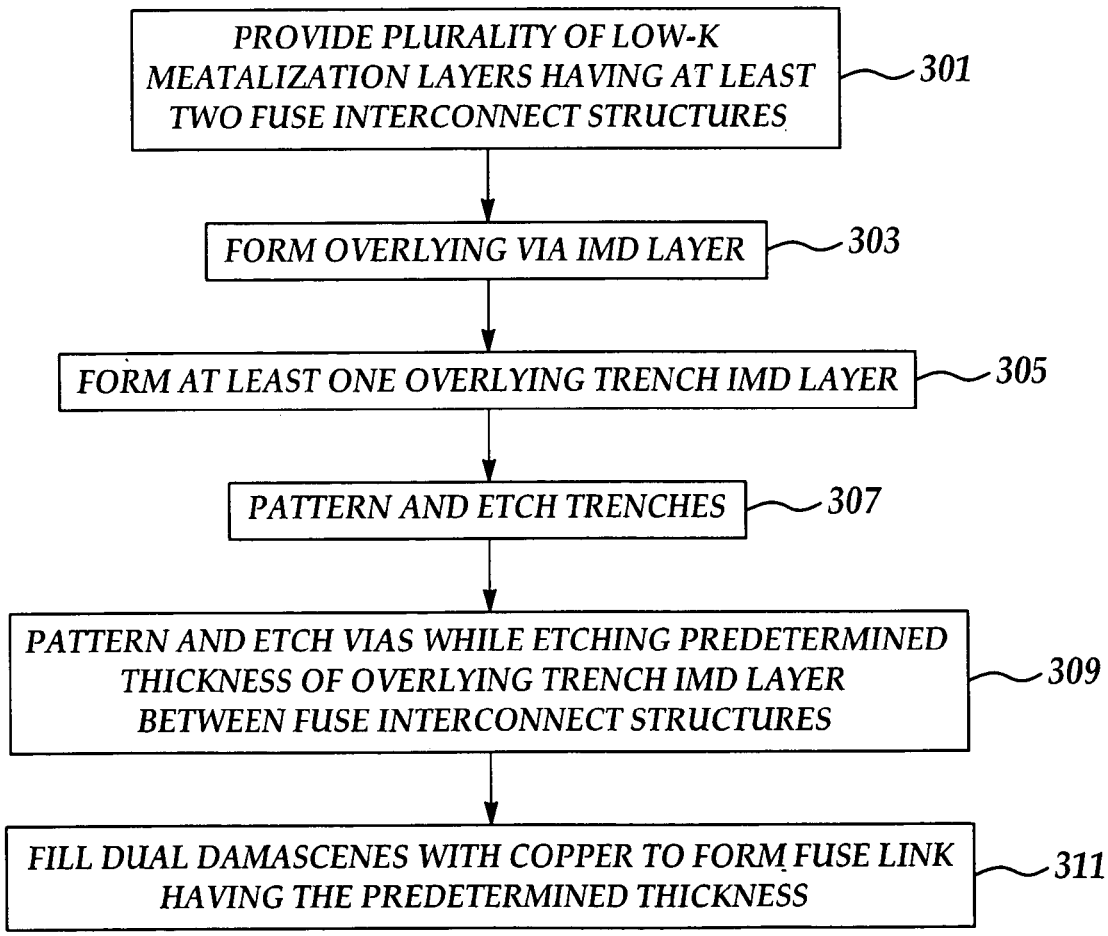
FIG. 3 is an exemplary process flow diagram including several embodiments of the present invention.

Referring to FIG. 3, is shown a process flow diagram including several embodiments of the present invention. In process 301 a plurality of metallization layers including low-K IMD layers are provided including at least two fuse interconnect structures. In process 303, an overlying via dielectric insulating layer (IMD layer) is deposited. In process 305, at least a second overlying trench line dielectric insulating layer (IMD layer) is deposited. In process 307, trench line openings are patterned and etched through the at least a second trench line dielectric insulating layer thickness to overlie the fuse interconnect structures. In process 309, via openings are patterned and etched in a bottom portion of the trench line openings including extending through the via insulating dielectric insulating layer thickness to form closed communication with the fuse interconnect structures forming a dual damascene opening. Simultaneously, a portion of the uppermost layer of the at least a second trench line dielectric insulating layer spanning an area overlying and between the fuse interconnect structures is etched to a predetermined thickness. In process 311, the dual damascene opening is filled with copper according to conventional processes to form a relatively thinner fuse link portion having the predetermined thickness spanning an area overlying and between the fuse link structures.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an improved fuse link structure comprising the steps of:

providing spaced apart first and second metal interconnect structures each respectively electrically interconnected to form fuse interconnect portions extending through a plurality of dielectric insulating layers including an uppermost metal interconnect layer;

forming a first dielectric insulating layer over the uppermost metal interconnect layer;

forming at least a second dielectric insulating layer over the first dielectric insulating layer;

forming first and second trench openings in said at least a second dielectric insulating layer to respectively overlie the first and second metal interconnect structures;

forming first and second via openings extending from a bottom portion of the respective first and second trench openings through the first dielectric insulating layer to respectively overlie the first and second metal interconnect structures while simultaneously etching away a predetermined thickness of the at least a second dielectric insulating layer spanning an area extending between the first and second trench openings; and, filling the first and second via openings and first and second trench openings with a metal to form a metal fuse link electrically interconnecting the first and second metal interconnect structures to form a metal fuse link portion comprising the predetermined thickness.

2. The method of claim 1, wherein the at least a second dielectric insulating layer comprises a lowermost dielectric insulating layer and an uppermost dielectric insulating layer separated by an etch stop layer formed at a level comprising the predetermined thickness.

3. The method of claim 1, wherein etch stop layers are formed to separate the first dielectric insulating layer and the at least a second dielectric insulating layer.

4. The method of claim 1, wherein a metal interconnect guard ring structure is formed in parallel to surround the fuse link and the fuse interconnect portions, said guard ring structure further extending downward through at least a portion of the plurality of dielectric insulating layers.

5. The method of claim 1, wherein a bottom anti-reflectance coating (BARC) comprising one of an organic and inorganic material is formed over and contacting an uppermost layer of the at least a second dielectric insulating layer.

6. The method of claim 1, wherein the plurality of dielectric insulating layers comprise a low-K inorganic material selected from the group consisting of fluorine doped silicon oxide, carbon doped silicon oxide, and organo-silane glass (OSG).

7. The method of claim 1, wherein the metal is selected from the group consisting of copper, aluminum, and alloys thereof.

8. The method of claim 7, wherein the metal consists primarily of copper.

9. The method of claim 8, wherein the step of filling further comprises the steps of:

depositing at least one of a refractory metal and refractory metal nitride to form a barrier layer lining the respective via and trench openings;

depositing a copper seed layer over the barrier layer;

carrying out an electrochemical deposition process to till the respective via and trench openings; and carrying out a chemical mechanical polishing process to remove excess copper overlying respective trench opening levels.

10. The method of claim 1, wherein the predetermined thickness is from about 1500 Angstroms to about 5000 Angstroms.

11. The method of claim 1, wherein the predetermined thickness is from about 2500 Angstroms to about 3500 Angstroms.

12. The method of claim 1, wherein the first and at least a second dielectric insulating layer are formed of a material selected from the group consisting of undoped silicate glass (USG), CVD silicon oxide, PECVD silicon oxide, and TEOS silicon oxide.

13. The method of claim 1, wherein the etch stop layer is selected from the group consisting of silicon carbide and silicon nitride.

14. The method of claim 1, wherein the at least a second dielectric insulating layer is formed at a thickness of from about 10000 Angstroms to about 40,000 Angstroms.

15. A method for forming a fuse link structure comprising the steps of:

providing spaced apart first and second metal interconnect structures extending through a plurality of dielectric layers;

forming at least one dielectric layer over said first and second interconnect structures;

forming damascene openings through a thickness of said at least one dielectric layer to respectively overlie said first and second interconnect structures while simultaneously removing a predetermined thickness portion of an upper portion of said at least one dielectric layer to span an area extending between said damascene openings;

filling the damascene openings with a metal including said predetermined thickness portion to form a metal fuse link electrically interconnecting the first and second metal interconnect structures to form a metal fuse link portion comprising the predetermined thickness.

16. The method of claim 15, wherein said damascene openings comprise dual damascene openings.

17. The method of claim 15, wherein said at least one dielectric layer comprises at least two dielectric layers.

18. The method of claim 17, further comprising an etch stop layer separating said at least two dielectric layers at about said predetermined thickness.

19. The method of claim 15, wherein said damascene openings comprise dual damascene openings wherein a respective via portion and a trench portion are separated by an etch stop layer.

20. The method of claim 15, wherein the predetermined thickness is from about 1500 Angstroms to about 5000 Angstroms.

21. The method of claim 15, wherein the at least one dielectric layer comprising the predetermined thickness is formed at a thickness of from about 10,000 Angstroms to about 40,000 Angstroms.

22. The method of claim 15, wherein said at least one dielectric layer is formed of a material selected from the group consisting of undoped silicate glass (USG), CVD silicon oxide, PECVD silicon oxide, and TEOS silicon oxide.

23. A method for forming a copper fuse link structure for blowing by laser ablation comprising the steps of:
   providing spaced apart first and second metal interconnect structures extending through a plurality of dielectric layers;
   forming a first dielectric layer over said first and second interconnect structures;
   forming at least a second dielectric layer over said first dielectric layer;
   forming damascene openings through a thickness of said first and at least a second dielectric layer to respectively overlie said first and second interconnect structures while simultaneously removing a predetermined upper thickness portion of said at least a second dielectric layer to form a fuse link opening spanning an area extending between said damascene openings;
   filling the damascene openings and fuse link opening with copper to form a copper fuse link electrically interconnecting the first and second metal interconnect structures.

24. The method of claim 23, wherein said damascene openings comprise dual damascene openings.

25. The method of claim 23, further comprising an etch stop layer separating said at least two dielectric layers at about said predetermined thickness.

26. The method of claim 23, wherein said damascene openings comprise dual damascene openings wherein a respective via portion and a trench portion are separated by an etch stop layer.

27. The method of claim 23, wherein said at least one dielectric layer is formed of a material selected from the group consisting of undoped silicate glass (USG), CVD silicon oxide, PECVD silicon oxide, and TEOS silicon oxide.

* * * * *